(12) United States Patent
Alwais

(10) Patent No.: US 6,362,675 B1
(45) Date of Patent: Mar. 26, 2002

(54) NONVOLATILE OCTAL LATCH AND D-TYPE REGISTER

(75) Inventor: Michael Alwais, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/614,157

(22) Filed: Jul. 11, 2000

Related U.S. Application Data
(60) Provisional application No. 60/143,344, filed on Jul. 12, 1999.

(51) Int. Cl.[7] ............................................. H03K 3/12
(52) U.S. Cl. .................... 327/218; 327/197; 327/403; 365/145; 365/185.08; 365/154; 326/40
(58) Field of Search ................... 327/185, 187, 327/403, 197, 199, 200–203, 207, 208, 211, 212–215, 216–218, 219; 377/115, 68; 326/93–98, 40; 365/185.07, 185.08, 185.26, 185.29, 145, 149, 154

(56) References Cited

U.S. PATENT DOCUMENTS

| | | | | |
|---|---|---|---|---|
| 3,676,717 A | * | 7/1972 | Lockwood | 365/184 |
| 4,571,704 A | | 2/1986 | Bohac, Jr. | 365/185.07 |
| 4,809,225 A | | 2/1989 | Dimmler et al. | 365/145 |
| 5,406,510 A | * | 4/1995 | Mihara et al. | 365/145 |
| 5,850,231 A | * | 12/1998 | Orimoto et al. | 345/533 |
| 5,923,184 A | | 7/1999 | Ooms et al. | 326/50 |

OTHER PUBLICATIONS

Bursky, Dave, "Logic That Remembers Opens Novel Applications", copyright 1989 Penton Publishing, Inc. Electronic Design, Jul. 13, 1989.

"High Speed CMOS Logic Octal D–Type Flip–Flop, Three–State Positive–Edge Triggered", Feb. 1998, Texas Instruments Incorporated.

"High Speed CMOS Logic Octal Transparent Latch, Three State Output", Nov. 1997, Texas Instruments Incorporated.

\* cited by examiner

*Primary Examiner*—Kenneth B. Wells
*Assistant Examiner*—Minh Nguyen
(74) *Attorney, Agent, or Firm*—William J. Kubida, Esq.; Peter J. Meza, Esq.; Hogan & Hartson, LLP

(57) ABSTRACT

An octal transparent latch or D-type register (or flip-flop) integrated circuit device may be packaged in an industry standard logic pin-out and configuration but having nonvolatile properties such as automatically recording the output state in nonvolatile form and restoring it on power up. The nonvolatile memory elements are ideally ferroelectric capacitors, using well known ferroelectric materials such as PZT, SBT, or BST or other ferroelectric materials. EEPROM, Flash, SNOS, or other writeable nonvolatile technologies can also be used. In a particular embodiment disclosed herein, the nonvolatile elements of the integrated circuit device are written only when the latched state changes to reduce write endurance changes thereto and data changes on either the input or output data lines that are not latched have no effect.

15 Claims, 7 Drawing Sheets

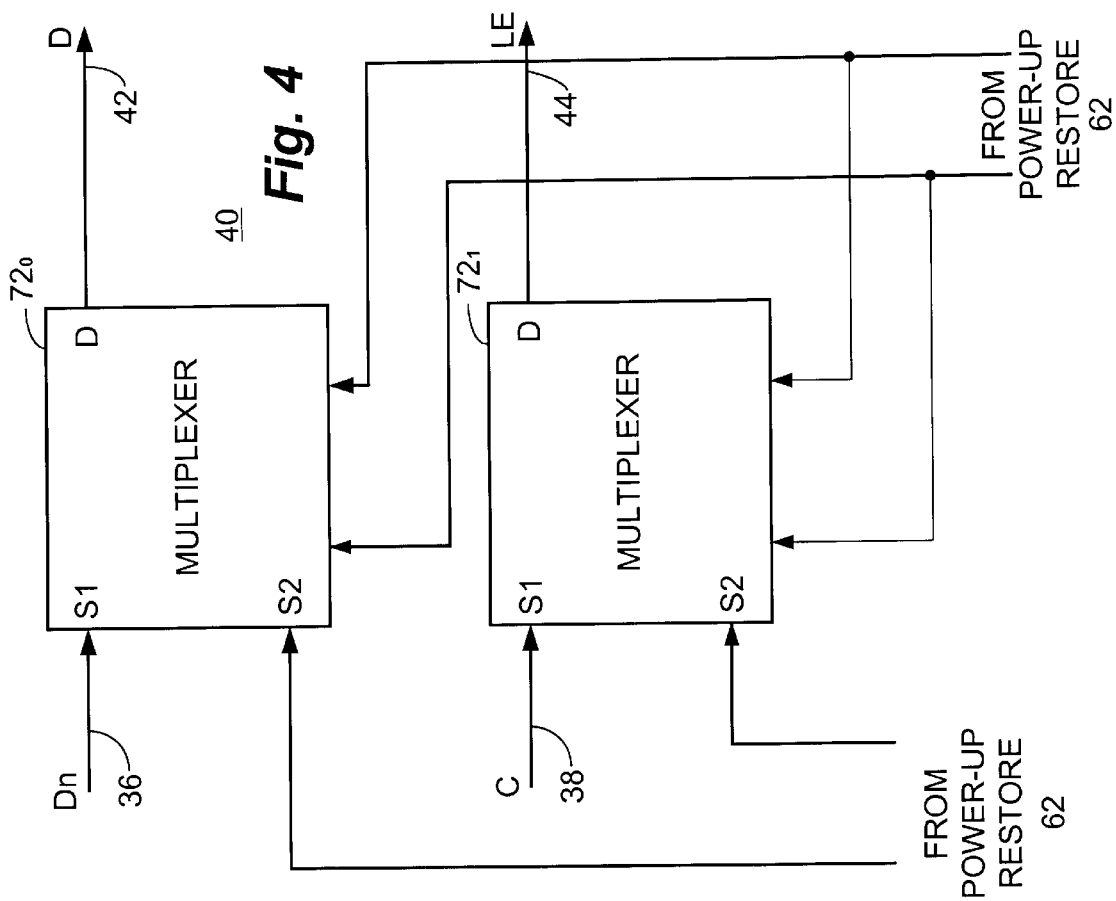
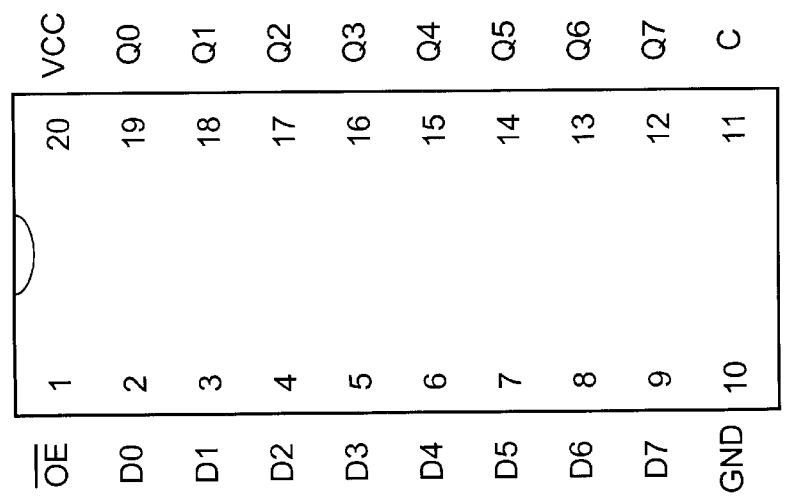

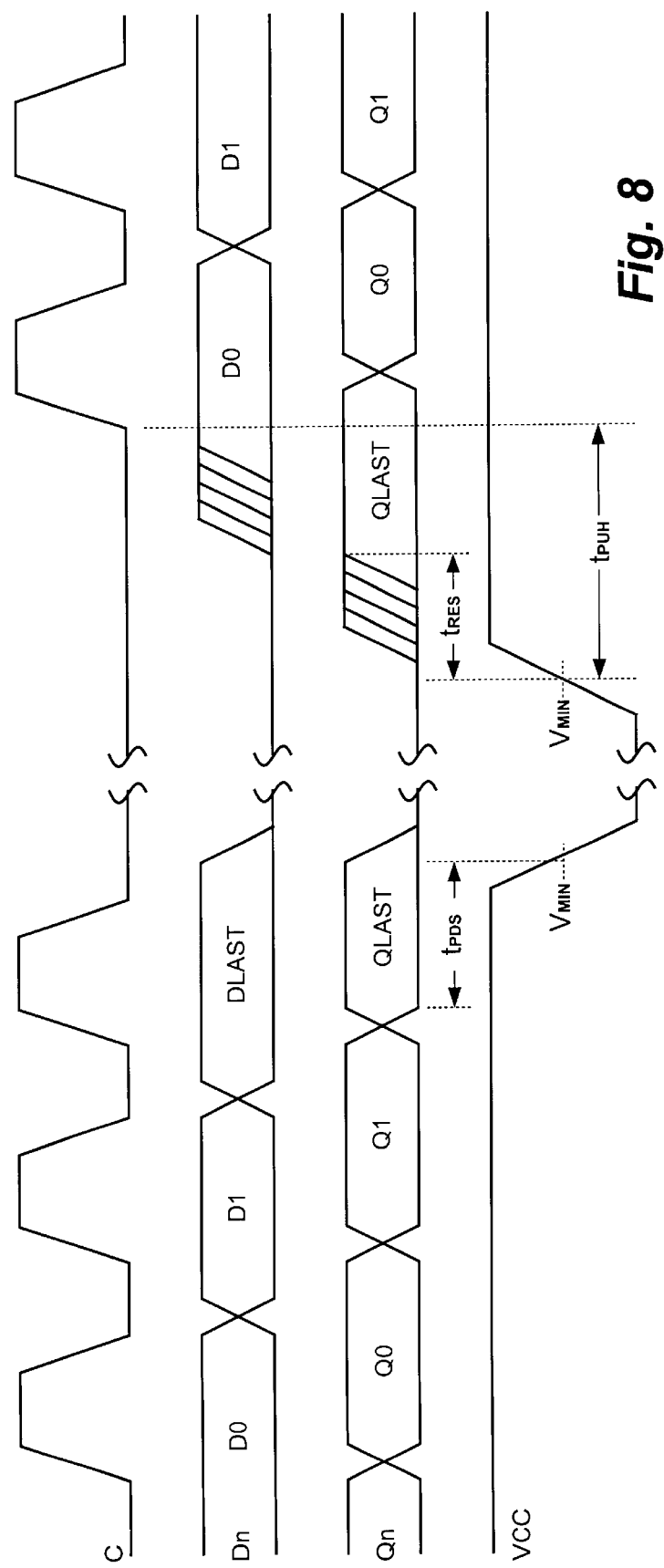

NONVOLATILE OCTAL LATCH AND D-TYPE REGISTER

CROSS REFERENCE TO RELATED PATENT APPLICATIONS

The present application is related to the subject matter of, and claims priority from, Provisional Patent Application Serial No. 60/143,344 filed Jul. 12, 1999 for: "Non-Volatile Octal Latch and D-type Register", the disclosure of which is herein specifically incorporated by this reference.

BACKGROUND OF THE INVENTION

The present invention relates, in general, to the field of integrated circuit (IC) logic devices. More particularly, the present invention relates to nonvolatile memory ICs and to the integration of nonvolatile memory elements with logic in the form of a nonvolatile latch and D-type register.

The semiconductor industry has employed transparent latches and D-type registers (also known as D-type flip-flops) for many years. These are ordinary complementary metal oxide semiconductor ("CMOS") and transistor-transistor logic ("TTL") circuits often referred to as members of the standard logic family. Standard logic parts have a variety of uses, but the information they contain while working is volatile. That is, the state of the logic is lost when power is removed. Similarly, the industry has employed nonvolatile memory for many years. These memory devices allow users to store information in nonvolatile form by supplying addresses and the data to be stored. To date, no one has merged these functions to create a standard logic device that retains its state in the absence of power.

What is desired, therefore, is a nonvolatile octal transparent latch that operates just as an industry standard CMOS version, except that the state is retained in the absence of power and is restored when power returns. Likewise, what is also desire is a nonvolatile octal D-type register that operates just as its industry standard counterpart, except that its state is nonvolatile and is automatically restored on power up.

SUMMARY OF THE INVENTION

It is an object of a nonvolatile octal latch embodiment of the present invention to provide a user controlled (as opposed to embedded) transparent latch with a nonvolatile shadow circuit to retain its state in the absence of power. Eight CMOS user controlled transparent latches are ideally provided in an industry standard product pin-out configuration each having nonvolatile shadow equivalents. The latch of the present invention maintains a volatile copy of the nonvolatile storage element contents for comparison purposes in order to avoid reading of the nonvolatile structure. The octal latch product of the present invention compares the state of each CMOS latch to the reference value and writes only changes of state to the nonvolatile shadow circuit to reduce write endurance cycles. The state of the latch, not the input, is monitored to store only latched conditions to reduce nonvolatile write cycles. Circuitry is provided to detect the status of power and to restore the state of the CMOS user latch on power up automatically from a nonvolatile shadow latch. The user state of the CMOS latch is restored by reading the nonvolatile shadow, placing the data in the input of the user latch, and creating an internal (not user generated) latch enable signal to load it. User access to internal latches through the inputs is prevented while the state is being restored.

It is an object of a nonvolatile D-type register embodiment of the present invention to provide a user controlled (as opposed to embedded) D-type register with a nonvolatile shadow element to retain its state in the absence of power. Eight CMOS user controlled D-type registers are provided in the product pin-out configuration each having nonvolatile shadow equivalents. A volatile copy of the nonvolatile storage element contents are maintained for comparison purposes, to avoid reading the nonvolatile structure. The state of each CMOS D-type register is compared to the reference value and only changes of state are written to the nonvolatile shadow to reduce write endurance cycles. The state of the D-type register, not the input, is monitored to load only stored conditions in nonvolatile memory in order to reduce nonvolatile write cycles. Circuitry is provided to detect the status of power and to restore the state of the CMOS user D-type register on power up automatically from a nonvolatile shadow storage. The user state of the CMOS D-type register is restored by reading the nonvolatile shadow, placing the data in the input of the register and creating an internal (not user generated) clock signal to load it. User access to internal D-type registers through the inputs is prevented while the state is being restored.

According to the present invention an octal latch or D-type register product is disclosed with an industry standard logic pin-out and configuration but having nonvolatile properties such as automatically recording the output state in nonvolatile form and restoring it on power up. The nonvolatile memory elements are ideally provided by a ferroelectric capacitor, using well known ferroelectric materials as lead ziconate titanate (PZT), SBT, or BST, or other well known ferroelectric materials. Non-volatility can also be provided by EEPROM, Flash, SNOS, or other writeable nonvolatile technologies. The benefits due to ferroelectric technology are related to writing all state changes. Other nonvolatile technologies can be used with power down writes and these can also be used with the present invention. It is also possible to configure the transparent latch or D-type register of the present invention to maintain a nonvolatile copy of the user-controlled latch that is written with the last state on power down.

Particularly disclosed herein is an integrated circuit device comprising a volatile latch circuit having data and latch enable input terminals and a data output terminal thereof. The volatile latch circuit is operative such that a data signal applied to its data input terminal is passed to the data output terminal when a clock signal applied to the latch enable input terminal is in a first state thereof and the data signal is latched when the clock signal is in a second state thereof. The device further comprises a nonvolatile circuit section including a nonvolatile latch circuit. The nonvolatile latch circuit stores the data signal latched in the volatile latch circuit when the clock signal is in the second state thereof, and the nonvolatile circuit section is operative for restoring the data signal stored in the nonvolatile latch circuit to the volatile latch circuit in the event that power to the integrated circuit device is interrupted.

Also particularly disclosed herein is a method for providing a nonvolatile integrated circuit logic device comprising the steps of latching a first data value in a volatile latch circuit; also latching the first data value in an associated nonvolatile latch circuit; monitoring a supply voltage level to the logic device; and retaining the first data value in the nonvolatile latch circuit when the monitored supply voltage level falls below a predetermined minimum level.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 3 is a possible circuit pin-out for the nonvolatile logic device of FIG. 2 in a conventional DIP, SOP, SOIC, PDIP or CERDIP package;

FIG. 4 is a more detailed functional block diagram of a possible implementation of the control selector block of FIG. 2;

FIG. 8 is an exemplary timing diagram for the power cycle of the device of FIG. 2 when configured as a nonvolatile D-type register in accordance with the timing diagram of FIG. 7.

DESCRIPTION OF A PREFERRED EMBODIMENT

Figure 1:
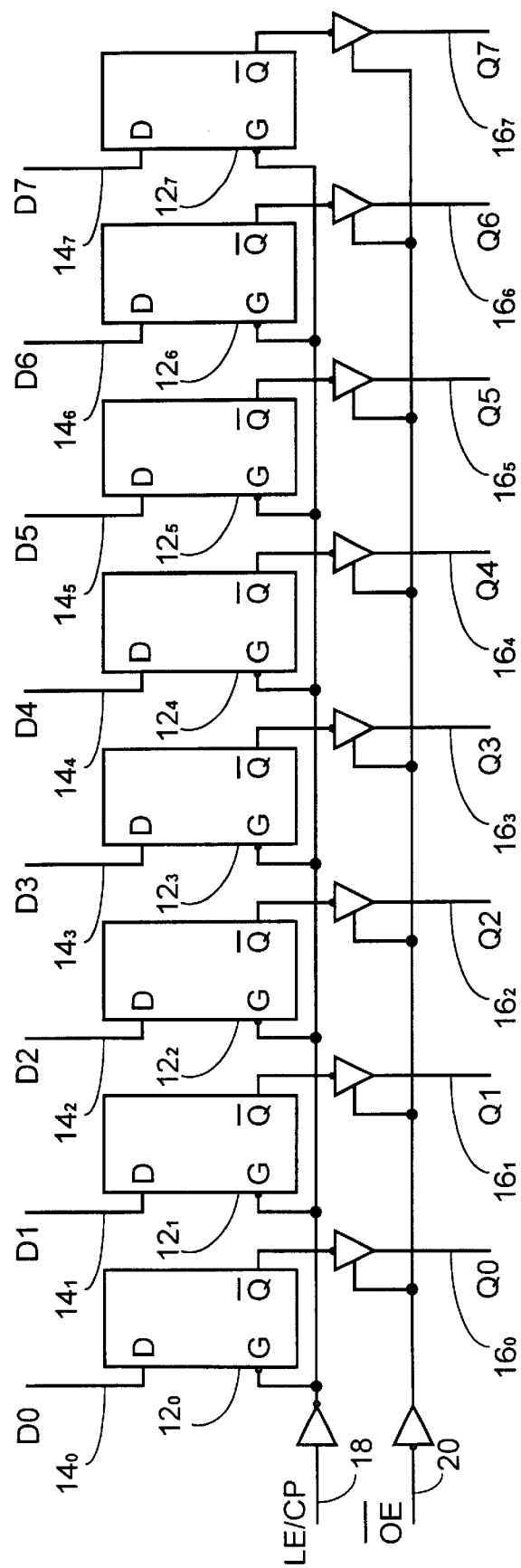
FIG. 1 is a functional block diagram of a conventional volatile CMOS logic octal transparent latch (equivalent of 74LS573 device, hereinafter '573 device) and D-type flip-flop (equivalent of 74LS574 device, hereinafter '574 device), or register, with three state output illustrated for purposes of comparison with the nonvolatile octal latch and D-type register of the present invention.

With reference now to FIG. 1, is functional block diagram of a conventional volatile CMOS logic octal transparent latch (an industry standard '573 device) and D-type flip-flop (an industry standard '574 device), or register, with three state output is illustrated for purposes of comparison with the nonvolatile octal latch and D-type register of the present invention. The device 10, as shown, comprises eight latches $12_0$ through $12_7$ integrated on a common substrate each of which has a data ("D") input thereof respectively coupled to one of the device 10 data inputs $14_0$ through $14_7$ denominated D0 through D7.

The device 10 includes a number of data output terminals $16_0$ through $16_7$ (Q0 through Q7) respectively coupled to the data output ("Q") terminal of each of the latches $12_0$ through $12_7$ through a number of gated inverting amplifiers. The device 10 also includes an active "High" (or active "Low") latch enable ("LE") input in the case of a '573 device or an active "High" or "Low" clock ("CP") input in the case of a '574 device. The LE or CP input 18 may be furnished through an inverter to the gating ("G") input of the latches $12_0$ through $12_7$. An active "Low" output enable ("/OE") input is coupled to the control terminals of the various gated inverting amplifiers to provide the data on the "Q" output of the latches $12_0$ through $12_7$ to the data output terminals Q0 through Q7.

A number of variations on the device 10 are commercially available including 74LS373 and 74LS374 devices which vary only in the device 10 pin-out from the '573 and '574 devices described above.

For the '573 variant of device 10, the following Truth Table 1 pertains:

Truth TABLE 1

| /OE | LE | Data | Output |
|-----|----|------|--------|
| L | H | H | H |
| L | H | L | L |
| L | L | \| | L |
| L | L | h | H |
| H | X | X | Z |

Where H = logic "High" voltage level; L = logic "Low" voltage level; X = Don't Care; Z = High Impedance State; | = "Low" voltage level one set-up time prior to the "High" to "Low" LE transition; h = "High" voltage level one set-up time prior to the "High" to "Low" LE transition.

For the '574 variant of device 10, the following Truth Table 2 pertains:

Truth TABLE 2

| | Inputs | | Output |
|---|---|---|---|
| /OE | LE | Dn | Qn |
| L | L -> H | H | H |
| L | L -> H | L | L |
| L | L | X | Q0 |
| H | X | X | Z |

Where H = logic "High" (steady state); L = logic "Low" (steady state); X = Don't Care; L -> H = Transition from "Low" to "High"; Q0 = Level of Q before the indicated steady state input conditions were established; and Z = High Impedance State.

Figure 2:
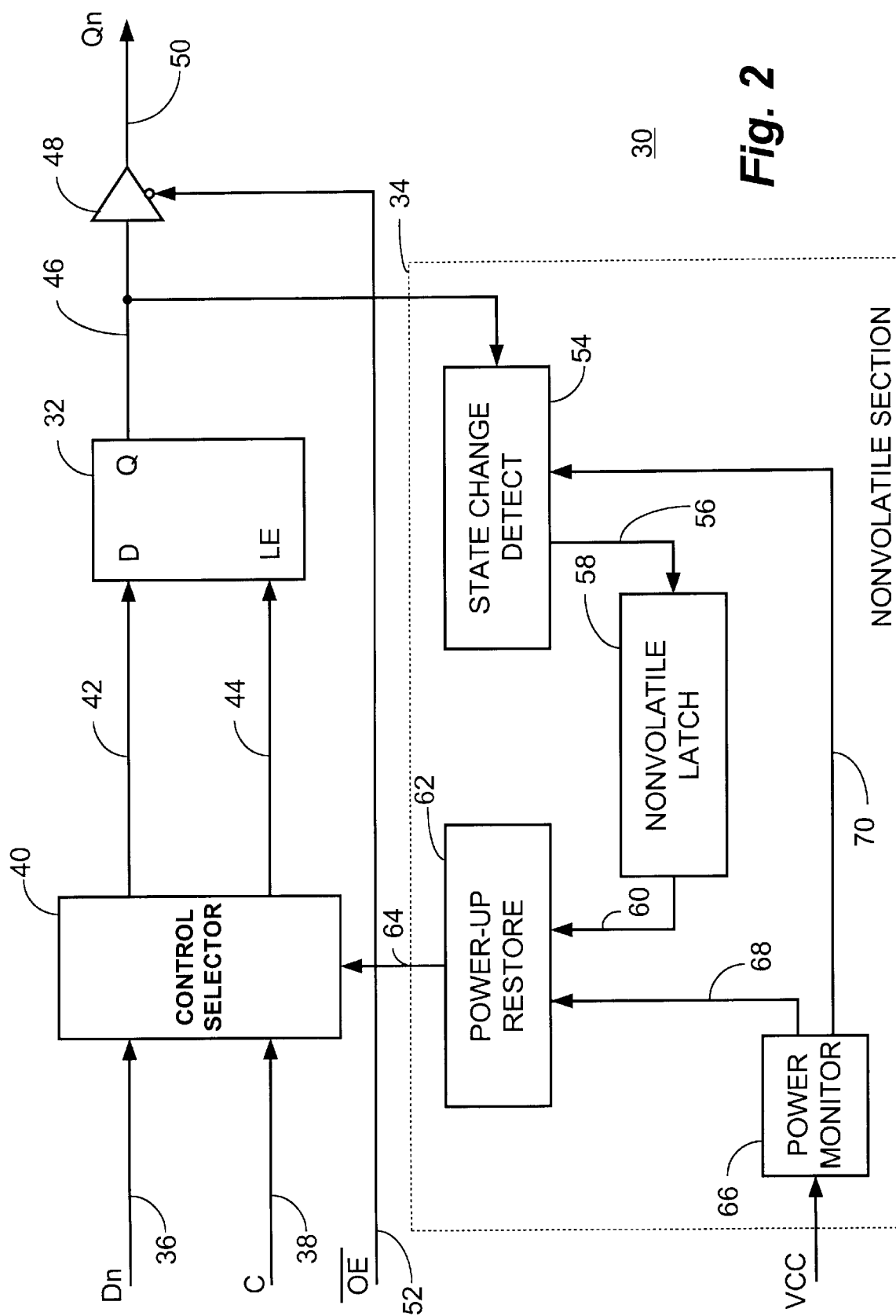
FIG. 2 is a simplified circuit block diagram of a nonvolatile integrated circuit logic device in accordance with the present invention for use as a nonvolatile latch circuit or nonvolatile D-type register integrated circuit.

With reference additionally now to FIG. 2, a simplified circuit block diagram of a nonvolatile integrated circuit logic device 30 in accordance with the present invention is shown for use as a nonvolatile latch circuit or nonvolatile D-type register circuit. The logic device 30 comprises a number (for example, eight in an octal device) of conventional volatile latch circuits 32 having data ("D") and latch enable ("LE") inputs and a data output ("Q") terminal. In accordance with the present invention, each of the latch circuits 32 has an associated nonvolatile section 34 as will be more fully described hereinafter.

Inputs to the logic device 30 are a conventional data input 36 (Dn, where n=0 through n=7 in an octal device) and a clock ("C") input 38. The data inputs 36 and clock input 38 are furnished to a number of control selector blocks 40 associated with each of the latch circuits 32. The control selector blocks 40 then provide a data signal on line 42 to the "D" input and a latch enable signal on line 44 to the "LE" input of the associated latch circuits 32. Output taken at the "Q" output of each of the latch circuits 32 is supplied on line 46 to a corresponding output gate 48 for output from the logic device 30 on one of a number of output lines 50 (Qn, where n=0 through n=7 in an octal device). An active "Low" output enable signal on line 52 is coupled to the control terminal of the output gates 48 for coupling line 46 to the corresponding one of the output lines 50.

The data output signal on line 46 is also coupled to a state change detection circuit 54 which serves to detect a change in state of the data output signal on line 46. The state change detection circuit 54 then provides the current state of the data on line 46 via line 56 to a nonvolatile latch circuit 58. The state stored in the nonvolatile latch circuit 58 can then be read out on line 60 to a power-up restore circuit 62 to provide one or more control signals to the control selector block 40 on lines 64. In addition, the device 30 supply voltage ("VCC") and a reference voltage are supplied to a power monitor circuit 66 which, in turn, provides device 30 power level information to the power-up restore circuit 62 on line 68 and the state change detection circuit 54 on line 70.

The device 30 stores inputs just like the conventional '573 and '574 logic families of device 10 (FIG. 1) and then retains the stored state in the absence of applied VCC power. Functionally, the device 30 solves three basic problems in an elegant fashion. First, it provides continuous access to nonvolatile system settings without performing a memory read operation or using dedicated processor input/output ("I/O") pins. Secondly, it allows the storage of signals or data that may change frequently and possibly without notice. Thirdly, it allows the nonvolatile storage of a few bits of data or system settings without the system overhead and extra pins of a serial memory. One embodiment of the device 30 is a transparent latch comparable to the '573 family of logic devices. In this embodiment, the inputs are passed to the outputs when the clock is "High" and the state is latched when the clock goes "Low". Another embodiment of the logic device 30 is a D type register comparable to the '574 family of logic devices. In this implementation, inputs are stored and passed to the outputs on the rising edge of the clock.

With reference additionally now to FIG. 3, a possible nonvolatile integrated circuit logic device 30 pin-out for an octal version of the device of FIG. 2 is shown in what may be a conventional DIP, SOP, SOIC, PDIP, CERDIP or other integrated circuit package depending upon the particular application. Pin 1 is the input for the active "low" output enable signal while pins 2 through 9 inclusive are inputs for the eight data inputs D0 through D&. Pin 10 is coupled to circuit ground while the clock/latch enable signal is supplied as an input to pin 11. Pins 12 through 19 inclusive provide outputs Q7 through Q0 respectively and the supply voltage, VCC, is supplied to pin 20.

With reference additionally now to FIG. 4, a more detailed functional block diagram of a possible implementation of the control selector block 40 illustrated in the preceding FIG. 2 is shown. With respect to this figure, like structure to that previously described with respect to the preceding figures is like numbered and the foregoing description thereof shall suffice herefor. As illustrated the control selector block 40 may comprise a pair of multiplexers $72_0$ and $72_2$ wherein the S1 inputs thereof are respectively coupled to lines 36 and 38, with their data outputs ("D") coupled to lines 42 and 44. The S2 inputs of the multiplexers $72_0$ and $72_1$ as well as their remaining inputs are coupled to receive a signal on one or more lines 64 from the power-up restore circuit 62.

Figure 5:
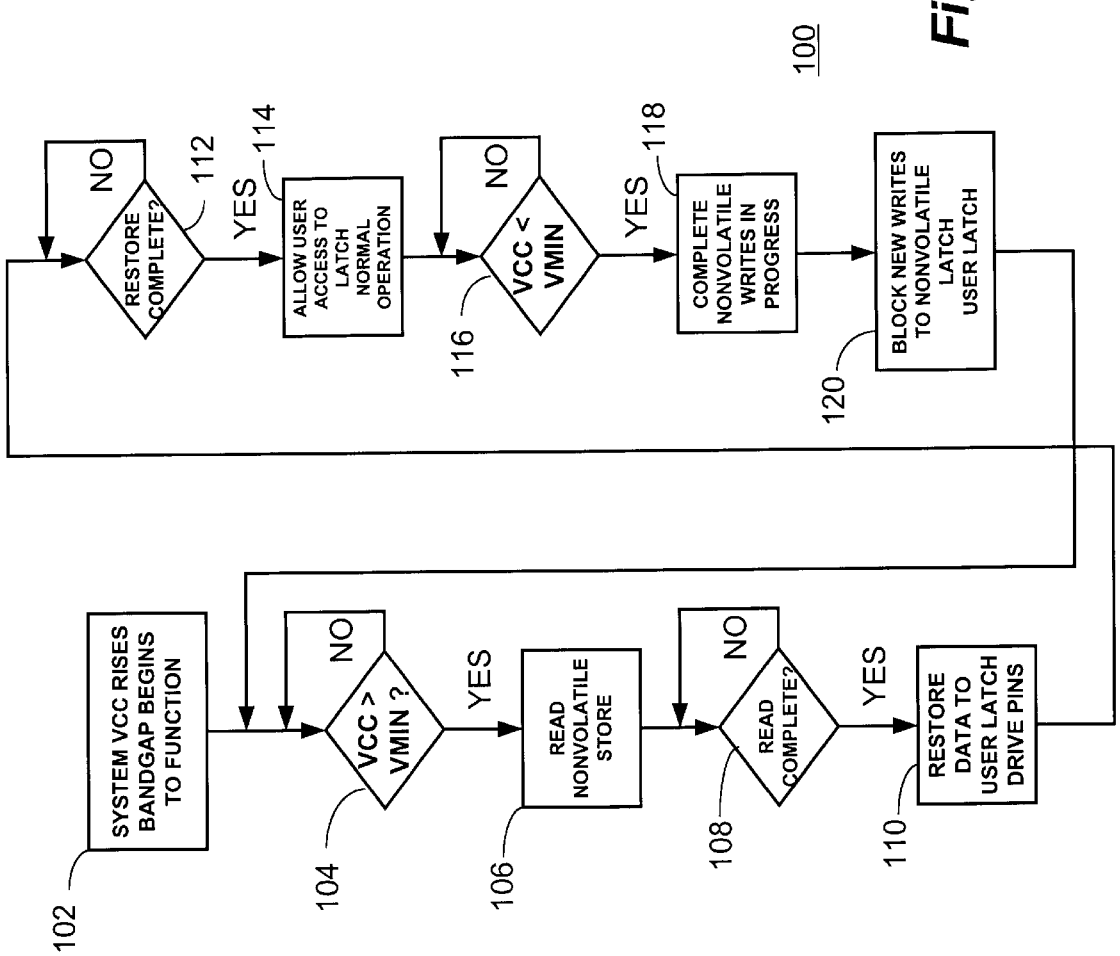
FIG. 5 is a representative logic flow chart of a possible power cycle for the integrated circuit device of FIG. 2.

With reference additionally now to FIG. 5, a representative logic flow chart of a possible power cycle 100 for the integrated circuit device of FIG. 2 is shown. The power cycle 100 begins at step 102 where, after the system supply voltage level rises, the bandgap begins to function. If the level of VCC is above a predetermined minimum voltage level "$V_{MIN}$" at decision step 104, the cycle 100 loops. When VCC>$V_{MIN}$, the process proceeds to step 106 wherein the nonvolatile store in the nonvolatile section 34 (FIG. 2) is read. If the read operation is not complete at decision step 108, the process loops until it is completed. Once completed, the process proceeds to step 110 where the data is restored to the user latch drive pins.

Until this restoration process is completed, the power cycle 100 process loops at decision step 112. Once completed, the user is allowed access to the volatile latch circuit 32 (FIG. 2) and normal operation is resumed at step 114. As long as VCC is equal to or greater than $V_{MIN}$, the process loops at decision step 116. Once VCC<$V_{MIN}$, all nonvolatile write operations in progress are completed at step 118 and new writes are blocked to the nonvolatile latch circuit 58 as well as the volatile user latch 32 at step $12_0$. At this point, the power cycle 100 process returns to decision step 104.

The logic device 30 functionality simplifies the design of system control functions with stored values being retained in the absence of supplied power. The logic device 30 may be pin and functionally compatible with their industry standard CMOS equivalents. In operation, any change in the latched state in latch circuit 32 is automatically written into a nonvolatile latch circuit 58. In a particular implementation of the present invention wherein the nonvolatile latch circuit 58 is implemented in ferroelectric technology, this function is possible due to the fast write time and extremely high write endurance of the underlying ferroelectric memory technology and a new state can become nonvolatile no more than 500 ns (VCC=5V) after the write operation begins.

Operationally, users interface to the conventional latch circuit 32 rather than directly to the nonvolatile latch circuit 58. Equivalent ferroelectric nonvolatile latches shadow the users latches. As such, they would offer a very high but not unlimited number of write-cycles.

Therefore, the internal state machine writes to the nonvolatile latch circuit 58 only if the latched state has changed in order to minimize the actual number of nonvolatile write-cycles. This determination is made independently for each bit. Due to the short write-time and realistic power slew rates, it is virtually impossible for the system to lose power before the nonvolatile state is acquired.

In a power down sequence, an internal power monitor blocks updates to the nonvolatile latch when VCC is below the level of $V_{MIN}$ (internal voltage reference). The power supply monitor 66 also blocks write access to the user latch circuit 32 when VCC is below $V_{MIN}$. To guarantee a proper nonvolatile write of the last value, state changes should cease a time ("$t_{PDS}$") before VCC reaches $V_{MIN}$. The $V_{MIN}$ threshold should be selected to be low enough such that no special action may be needed in systems with slow slew rates. For fast power supply slew-rates or for systems that run down to relatively low supply voltages, the user should employ some form of low-VCC reset that trips above the level of $V_{MIN}$.

Upon power up, the threshold is a critical parameter for several aspects of product operations and the logic device 30 automatically restores the Qn outputs (and internal latches) to the previously stored state. This process begins as VCC rises to the level of $V_{MIN}$ and is completed a time ("$t_{RES}$") afterward. Thus for all practical purposes, the nonvolatile values have been restored as soon as the system logic is functional on power up. After the restore process, the latch is indistinguishable from its last state prior to power down and operates normally.

In operation, upon detection of a power-up, the internal nonvolatile latch circuit 58 is read. This value is then placed on an internal version of the Dn input. A single internal clock is generated to cause the user latch circuit 32 to accept the restored data. After this process is complete, the latch provides normal user-controlled operation. Users should not attempt to latch externally supplied data prior to a time ("$t_{PUH}$") after VCC reaches the level of $V_{MIN}$.

In one implementation of the logic device 30, it functions as an octal transparent latch and the Qn outputs track the Dn inputs while the clock signal is at a logic 1. When the C signal goes to logic 0, the Dn inputs are latched. In this aspect, the logic device 30 operates identically to a conventional latch of the same '573 type. As described previously, it has the same functional truth table as an ordinary '573-type product. The logic device 30 is unique in its behavior during power up and power down and it also is unique in providing behind the scenes intelligence to manage the storage of settings.

Each latched state is compared to the stored nonvolatile state and comparison is made for each individual bit. If any bit has changed from its stored value, the new bit value automatically is written to the corresponding nonvolatile ferroelectric latch circuit 58. Only the changed bits are written. For the transparent version, unlatched changes on the Qn outputs are not written to nonvolatile storage. This operation continues as long as power is within tolerance (i.e. above $V_{MIN}$). The nonvolatile circuit operates entirely in the background and has no operating impact. When power is lost, the nonvolatile shadow-latches retain the final latched state.

On power up, the nonvolatile ferroelectric latch circuits 58 are read. The outputs of these latch circuits is then placed on the internal Dn inputs. The power control circuit will then cause the internal clock signal to go "High". Rather than passing the input signals to the output in transparent fashion, it will pass the nonvolatile value instead. After satisfying the minimum high clock-time, the internal clock is released and the nonvolatile value is loaded into the user latch circuit 32. This entire restore process takes $t_{RES}$ from $VCC>V_{MIN}$. After the restored nonvolatile value is loaded into the user latch circuit 32, normal operation begins. The first user write should occur a time $t_{PUH}$ after $VCC>V_{MIN}$.

In another implementation of the logic device 30, it functions as an octal D-register. In this regard, its behavior is similar to that of a transparent latch except that the Qn outputs do not change until the rising edge of the clock. On the rising edge of the clock signal, the inputs are loaded and passed to the Qn outputs. In this aspect, it operates identically to a conventional '574 latch of the same type.

The latched state is compared to the stored nonvolatile state for each bit. If any bit has changed from its stored value, the new value is automatically written to the nonvolatile ferroelectric latch circuit 58. This operation continues as long as power is within tolerance. The nonvolatile circuit operates entirely in the background and has no operating impact. When power is lost, the nonvolatile shadow-latch circuits 58 retain the last latched state.

On power up, the ferroelectric latch circuits 58 are read. The outputs of these latches are then be placed on the internal Dn inputs. The power control circuit will then cause the internal clock signal to go "High". This rising edge passes the nonvolatile value instead of the external input into the user register. The internal clock is then released and the nonvolatile value will be stored into the user register. This entire restore process takes $t_{RES}$ from $VCC>V_{MIN}$. After the restored nonvolatile value is loaded into the user register, normal operation begins. The first user write should occur $t_{PUH}$ after $VCC>V_{MIN}$.

In operation, the logic device 30 operates at a speed that is comparable to the industry standard "HC" family logic. However, the nonvolatile-write operations, while fast in nonvolatile memory terms, are somewhat slower. Therefore, the nonvolatile logic runs behind the user logic. Three practical scenarios can be identified. One scenario that is not practical is to have rapidly changing states, at high speed, continuing indefinitely. For example, an address latch on a microprocessor bus in not feasible due to limited nonvolatile write endurance. First, a free running clock in the kHz (or less) range may be applied to the logic device 30. In this application, the nonvolatile logic can keep pace with state changes and continue for relatively long periods to indefinitely depending on the clock frequency. Slow mechanisms such as relays and valves can be controlled, and front panel interfaces can be made.

The second scenario is to employ an event driven clock. In this regard, the host issues one clock or a high-speed burst as needed to the logic device 30. In the case of a high speed burst, the nonvolatile logic may get behind, but will catch up when the burst is completed. A special variation is to connect the clock input to a power-down reset device. This circuit captures a snapshot of the inputs on power-down. In this application, care must be taken in the system design to avoid capturing the inputs on power-up and thereby losing the old setting. A clock that is either software generated or controlled by other logic may be used as well.

The third scenario is to monitor a continuous data stream and to hold it when an event occurs. This is analogous to a nonvolatile track-and-hold function. For this case, the hold signal is applied to a transparent latch implementation of the logic device 30.

Figure 6:
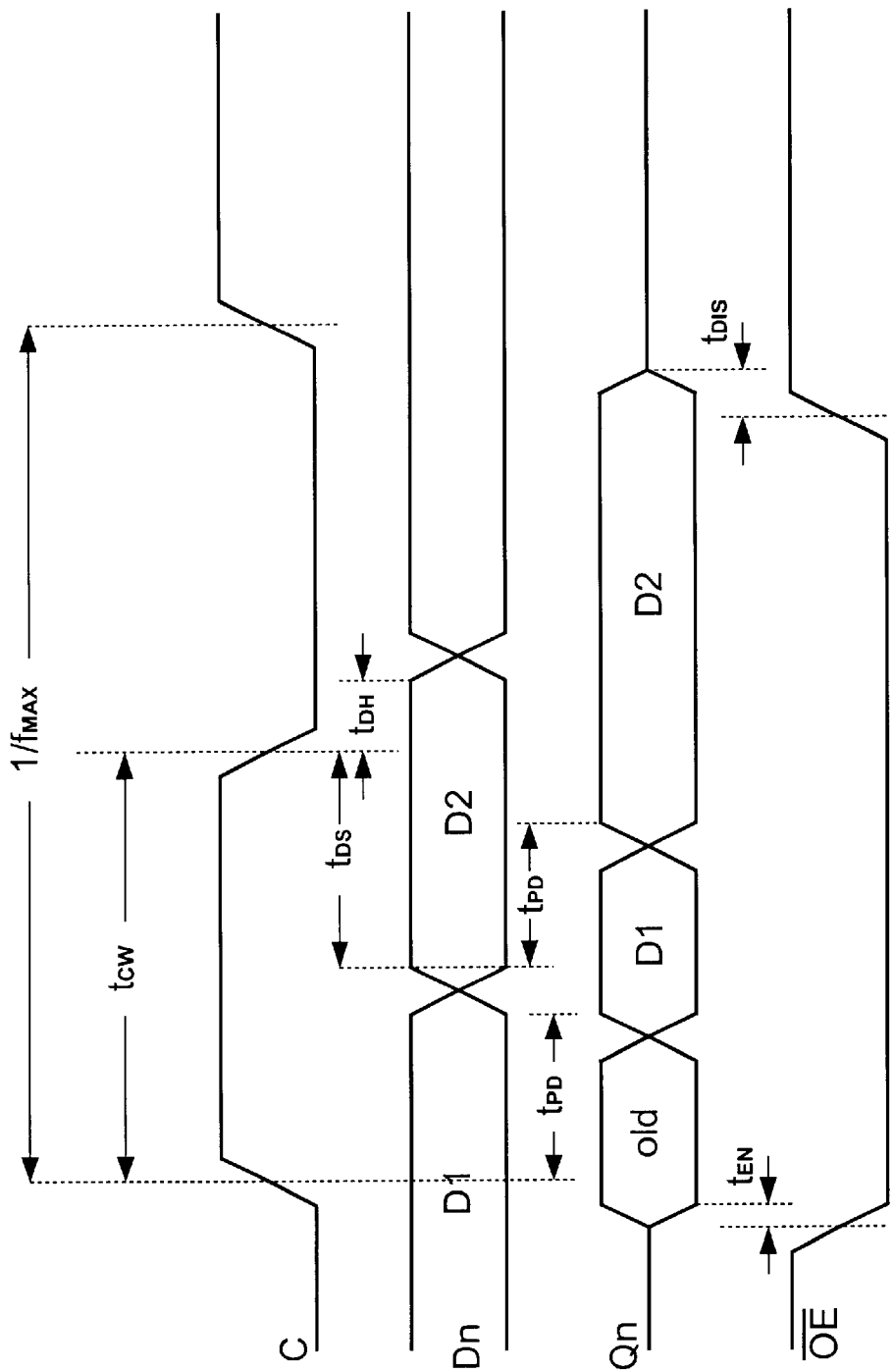
FIG. 6 is a representative timing diagram illustrating the interrelationship between the clock, data input, data output and logic low output enable signals for the device of FIG. 2 when configured as a nonvolatile octal latch in accordance with one embodiment of the present invention.

With reference additionally now to FIG. 6, a representative timing diagram illustrating the interrelationship between the clock ("C"), data input ("Dn"), data output (Qn) and logic low output enable ("/OE") signals for the device of FIG. 2 is shown when configured as a nonvolatile octal latch ('573 type) in accordance with one embodiment of the present invention.

With respect to this figure, the correspondence among the clock signal ("C") on line 38, the data ("Dn") signal on line 36, the output data ("Qn") signal on line 50 and the active "Low" output enable ("/OE") signal on line 52 is shown. In this regard, $f_{MAX}$ is the maximum clock signal frequency; $t_{CW}$ is the clock signal minimum pulse width; $t_{DS}$ is the data setup time Dn to clock "Low"; $t_{DH}$ is data hold time Dn after clock "Low"; $t_{PD}$ is the propagation delay Dn to Qn and clock to On; $t_{EN}$ is output enable time /OE to Qn; and $t_{DIS}$ is the output disable time /OE to Qn high impedance.

Figure 7:
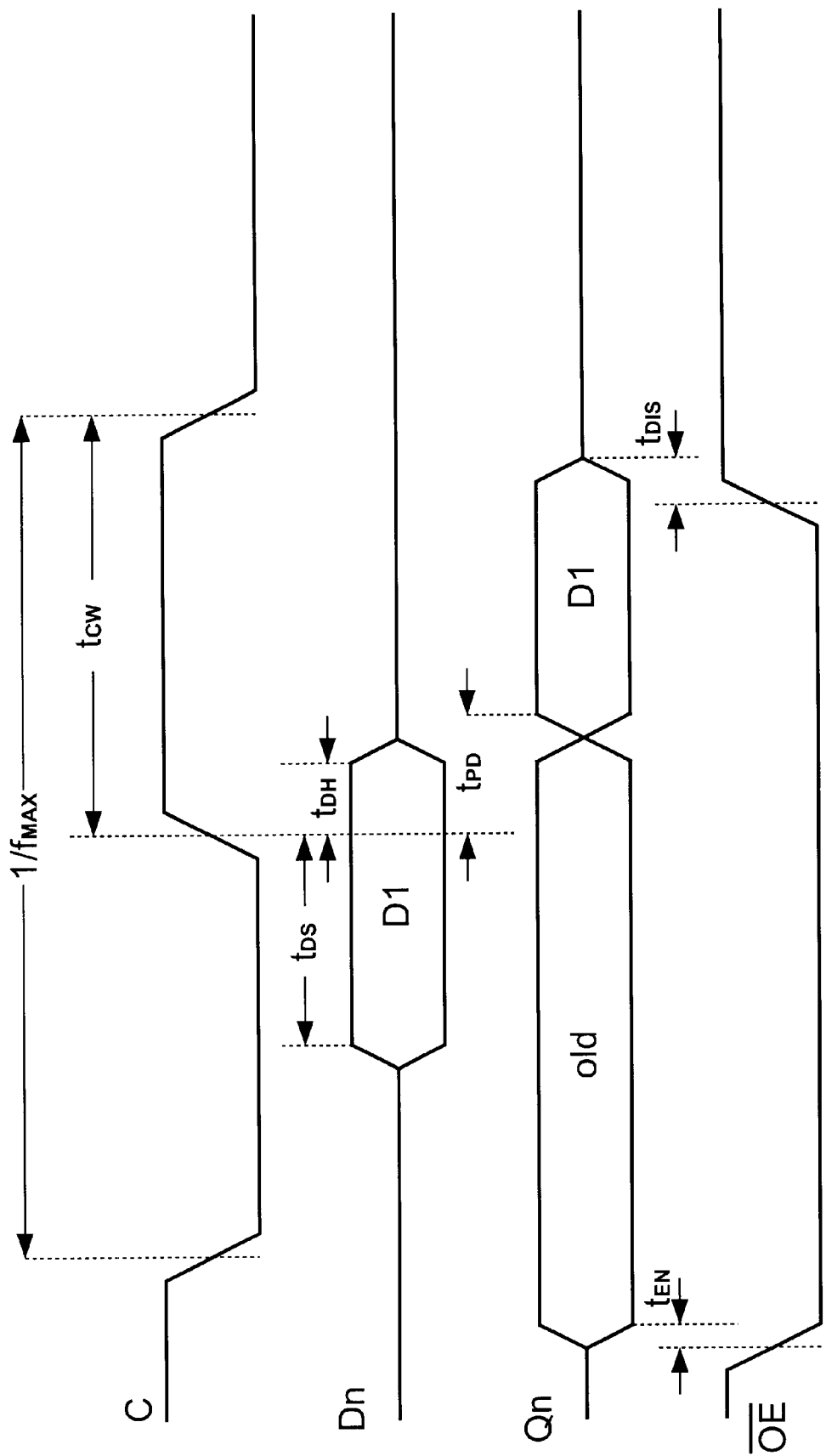
FIG. 7 is another representative timing diagram illustrating the interrelationship between the clock, data input, data output and logic low output enable signals for the device of FIG. 2 when configured as a nonvolatile D-type register in accordance with another embodiment of the present invention.

With reference additionally now to FIG. 7, another representative timing diagram illustrating the interrelationship between the clock, data input, data output and logic low output enable signals for the device of FIG. 2 is shown when configured as a nonvolatile D-type register ('574 type) in accordance with another embodiment of the present invention.

With respect to this figure, the correspondence among the clock signal on line 38, the data signal on line 36, the output data signal on line 50 and the active "Low" output enable signal on line 52 is shown. In this regard, $f_{MAX}$ is again the maximum clock signal frequency; $t_{CW}$ is the clock signal minimum pulse width; $t_{DS}$ is the data setup time Dn to clock transition to "High"; $t_{DH}$ is data hold after clock "High"; $t_{PD}$ is the propagation delay Dn to Qn and clock to Qn; $t_{EN}$ is output enable time /OE to Qn; and $t_{DIS}$ is the output disable time /OE to Qn high impedance.

With reference additionally now to FIG. 8, an exemplary timing diagram for the power cycle of the device of FIG. 2 is shown, for example, when configured as a nonvolatile D-type register in accordance with the timing diagram of FIG. 7.

With respect to this figure, the correspondence among the clock signal on line 38, the data signal on line 36, the output data signal on line 50 and the supply voltage level ("VCC") is shown. In this regard, $t_{PDS}$ is the time from last state change to $V_{MIN}$; $t_{RES}$ is the time from $V_{MIN}$ to output valid; and $t_{PUH}$ is the time from $V_{MIN}$ to the first user write. It should be noted that data retention is measured from the last state change and is the time that a state will be retained and correctly restored on power-up. The process of powering up the logic device 30 (and reading the nonvolatile state) refreshes the stored state and re-starts the data retention period even if the state is unchanged.

The nonvolatile elements of the logic device 30 are written when the latched state changes. Changes on either Dn or Qn that are not latched have no effect. The last write to the nonvolatile latch circuit 58 should occur prior to reaching the level of $V_{MIN}$ during a power down. After the power supply level VCC reaches approximately $V_{MIN}$, during a power up operation, the nonvolatile latch circuit 58 is read and the value restored to the user latch circuit 32.

While there have been described above the principles of the present invention in conjunction with specific integrated device structure and functionality, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device including at least one data input and data output terminals, and a latch enable terminal, said integrated circuit device comprising:
   at least one volatile latch circuit for providing an output signal to said at least one data output terminal;
   at least one first multiplexer circuit being coupled to said at least one data input terminal for providing a data signal to said at least one volatile latch circuit;
   at least one second multiplexer circuit, said at least one second multiplexer circuit being coupled to said latch enable terminal to provide a clock signal to said at least one volatile latch circuit;
   at least one state change detector circuit coupled to receive said output signal from said at least one volatile latch circuit, said state change detector circuit producing a state change signal in response to a change of state of said output signal;
   at least one nonvolatile latch circuit coupled to receive said state change signal; and
   at least one restore state circuit coupled to an output of said at least one nonvolatile latch circuit, said at least one restore state circuit coupled to an input of said at least one second multiplexer circuit and said at least one first multiplexer circuit for providing a stored state in said at least one nonvolatile latch circuit to said at least one volatile latch circuit.

2. The integrated circuit device of claim 1 wherein said at least one nonvolatile latch circuit comprises a ferroelectric device.

3. An integrated circuit device comprising:
   at least one volatile latch circuit having data and latch enable input terminals and a data output terminal thereof, said volatile latch circuit operative such that a data signal applied to said data input terminal is passed to said data output terminal when a clock signal applied to said latch enable input terminal is in a first state thereof and said data signal is latched when said clock signal is in a second state thereof;
   at least one nonvolatile circuit section including a nonvolatile latch circuit, said nonvolatile latch circuit for storing said data signal latched in said volatile latch circuit when said clock signal is in said second state thereof, said nonvolatile circuit section for restoring said data signal stored in said nonvolatile latch circuit to said volatile latch circuit in the event that power to said integrated circuit device is interrupted;
   at least one first multiplexer circuit being coupled to said at least one data input terminal for providing said data signal to said at least one volatile latch circuit; and
   at least,one second multiplexer circuit, said at least one second multiplexer circuit being coupled to said latch enable input terminal to provide said clock signal to said at least one volatile latch circuit.

4. The integrated circuit device of claim 3 further comprising:
   a state change detect circuit coupled to said data output terminal of said volatile latch circuit to write said data signal latched in said volatile latch circuit to said nonvolatile latch circuit when a state of said data signal transitions from a first state thereof to a second state thereof.

5. A method for providing a nonvolatile integrated circuit logic device comprising:
   latching a first data value in a volatile latch circuit;
   also latching said first data value in an associated nonvolatile latch circuit;
   monitoring a supply voltage level to said logic device;
   retaining said first data value in said nonvolatile latch circuit when said monitored supply voltage level falls below a predetermined minimum level;
   selectively controlling the first data value using a first multiplexer circuit being coupled to said volatile latch circuit; and
   selectively controlling a clock signal using a second multiplexer circuit being coupled to said volatile latch circuit.

6. The method of claim 5 further comprising:
   restoring said first data value retained in said nonvolatile latch circuit to said volatile latch circuit when said monitored supply voltage level rises to said predetermined minimum level.

7. The method of claim 5 further comprising:
   further latching a second data value in said volatile latch circuit; and
   also further latching said second data value in said associated nonvolatile latch circuit.

8. The method of claim 7 wherein said step of also further latching said second data value in said associated nonvolatile latch circuit occurs only when said first data value is not equal to said second data value.

9. The method of claim 5 further comprising:
reading said first data value from said volatile latch circuit and not said nonvolatile latch circuit.

10. A nonvolatile latch circuit comprising:
a user controlled, non-embedded transparent latch;
a nonvolatile circuit section including a nonvolatile latch coupled to said latch to retain its state in the absence of power;
a first multiplexer circuit for providing a data signal to said latch; and
a second multiplexer circuit for providing a clock signal to said latch.

11. The nonvolatile latch circuit of claim 10 further comprising a band-gap reference circuit to set a restore supply voltage point or to prevent low voltage writes.

12. A method of operating a nonvolatile latch including the steps of:
maintaining a volatile copy of a nonvolatile storage element content for comparison purpose;
comparing the state of a CMOS latch to a reference value and writing only changes of state to a nonvolatile circuit section to reduce write endurance cycles;
monitoring he state of the CMOS latch, not the input, to store only latched data to reduce nonvolatile write cycles;
providing circuitry to detect the status of power and to restore the state of the CMOS latch on power up automatically from the nonvolatile circuit section;
restoring the state of the CMOS latch by reading the nonvolatile circuit section placing the data in the input of the CMOS latch, and creating an artificial, non-user generated latch enable signal to load it; and
preventing user access to the CMOS latch while the state is being restored;
selectively controlling a data value using a first multiplexer circuit being coupled to said volatile latch circuit; and
selectively controlling a clock signal using a second multiplexer circuit being coupled to said CMOS latch circuit.

13. A D-type register circuit comprising:
a user controlled, non-embedded D-type register;
a nonvolatile circuit section including a nonvolatile latch coupled to said D-type register to retain its state in the absence of power;
a first multiplexer circuit for providing a data signal to said register; and
a second multiplexer circuit for providing a clock signal to said register.

14. The D-type register circuit of claim 13 further comprising a band-gap reference circuit to set a restore supply voltage point or to prevent low voltage writes.

15. A method of operating a D-type register circuit including the steps of;
maintaining a volatile copy of a nonvolatile storage element content for comparison purpose;
comparing the state of a CMOS D-flip flop to a reference value and writing only changes of state to a nonvolatile circuit section to reduce write endurance cycles;
monitoring the state of the CMOS D-flip flop, not the input, to store only latched data reduce nonvolatile write cycles;
providing circuitry to detect the status of power and to restore the state of the CMOS D-flip flop on power up automatically from the nonvolatile circuit section;
restoring the state of the CMOS D-type register by reading the nonvolatile circuit section placing the data in the input of the flip-flop, and creating an artificial, non-user generated clock signal to load it; and
preventing user access to the D-flip flop while the state is being restored
selectively controlling a data value using a first multiplexer circuit being coupled to said CMOS D flip-flop; and
selectively controlling a clock signal using a second multiplexer circuit being coupled to said CMOS D flip-flop.

* * * * *